(12) United States Patent
Kuttner

(10) Patent No.: US 8,854,127 B2
(45) Date of Patent: Oct. 7, 2014

(54) DC-DC CONVERTER FOR ENVELOPE TRACKING

(75) Inventor: Franz Kuttner, Villach (AT)

(73) Assignee: Intel Mobile Communications GmbH, Neubiberg (DE)

( * ) Notice: Subject to any disclaimer, the term of this patent is extended or adjusted under 35 U.S.C. 154(b) by 186 days.

(21) Appl. No.: 13/471,839

(22) Filed: May 15, 2012

(65) Prior Publication Data
US 2013/0307615 A1 Nov. 21, 2013

(51) Int. Cl.
*H03G 3/20* (2006.01)

(52) U.S. Cl.
USPC ............................. 330/136; 300/127; 300/297

(58) Field of Classification Search
USPC .......................................... 330/136, 127, 297
See application file for complete search history.

(56) References Cited

U.S. PATENT DOCUMENTS

| | | | |
|---|---|---|---|
| 6,853,244 B2* | 2/2005 | Robinson et al. ................ 330/51 |
| 7,649,413 B2* | 1/2010 | Shiikuma ...................... 330/136 |
| 7,830,220 B2* | 11/2010 | Ceylan et al. ................. 332/145 |
| 8,180,303 B2* | 5/2012 | Dupuy et al. ............... 455/114.1 |
| 2004/0019827 A1 | 1/2004 | Rohfleisch et al. |
| 2004/0046607 A1* | 3/2004 | Grange ........................... 330/10 |
| 2012/0062323 A1* | 3/2012 | Le Gallou et al. ............ 330/297 |
| 2013/0021827 A1* | 1/2013 | Ye ................................... 363/17 |

OTHER PUBLICATIONS

Vahid Yousefzadeh, et al., "Digitally Controlled DC-DC Converter for RF Power Amplifer", IEEE 2004, p. 81-87.
Lars T. Jakobsen, et al., "Digitally Controlled Envelope Tracking Power Supply for an RF Power Amplifier", IEEE 2007, p. 636-642.

* cited by examiner

*Primary Examiner* — Patricia Nguyen
(74) *Attorney, Agent, or Firm* — Eschweiler & Associates, LLC

(57) ABSTRACT

Embodiments provide a DC-DC converter (DC-DC=direct current to direct current) for envelope tracking. The DC-DC converter includes a digital control stage and a driving stage. The digital control stage is configured to provide a digital control signal based on digital information describing an amplitude of a digital baseband transmit signal. The driving stage is configured to provide a supply voltage for an RF amplifier (RF=radio frequency) based on the digital control signal.

22 Claims, 8 Drawing Sheets

DC-DC CONVERTER FOR ENVELOPE TRACKING

FIELD

Embodiments relate to a DC-DC converter (DC-DC=direct current to direct current) for envelope tracking. Some embodiments relate to a method for envelope tracking. Furthermore, some embodiments relate to a method for manufacturing a DC-DC converter for envelope tracking.

BACKGROUND

To improve the efficiency of an RF power amplifier, envelope tracking can be used. Envelope tracking means that the supply voltage of the power amplifier is changed with the transmitted output power of the power amplifier. The best efficiency can be reached by using a DC-DC converter for this generation of the supply voltage.

SUMMARY OF THE INVENTION

Embodiments provide a DC-DC converter (DC-DC=direct current to direct current) for envelope tracking. The DC-DC converter comprises a digital control stage and a driving stage. The digital control stage is configured to provide a digital control signal based on a digital information describing an amplitude of a digital baseband transmit signal. The driving stage is configured to provide a supply voltage for an RF amplifier (RF=radio frequency) based on the digital control signal.

Further embodiments provide a DC-DC converter for envelope tracking. The DC-DC converter comprises a digital modulator and an inverter. The digital modulator is configured to provide a modulated digital control signal based on digital information describing an amplitude of a digital baseband transmit signal. The inverter is configured to provide a first voltage in response to a first state of the modulated digital control signal and provide a second voltage in response to a second state of the modulated digital control signal as a supply voltage for an RF amplifier.

Some embodiments provide a method for envelope tracking. The method comprises providing a digital control signal based on digital information describing an amplitude of a digital baseband transmit signal, and providing a supply voltage for an RF amplifier based on the digital control signal.

Furthermore, some embodiments provide a method for manufacturing a DC-DC converter for envelope tracking. The method comprises providing a digital control stage configured to provide a digital control signal based on digital information describing an amplitude of a digital baseband transmit signal of a digital transmitter, and providing a driving stage configured to provide a supply voltage for an RF amplifier based on the digital control signal.

BRIEF DESCRIPTION OF THE DRAWINGS

Embodiments of the present invention are described herein making reference to the appended drawings.

Figure 1:
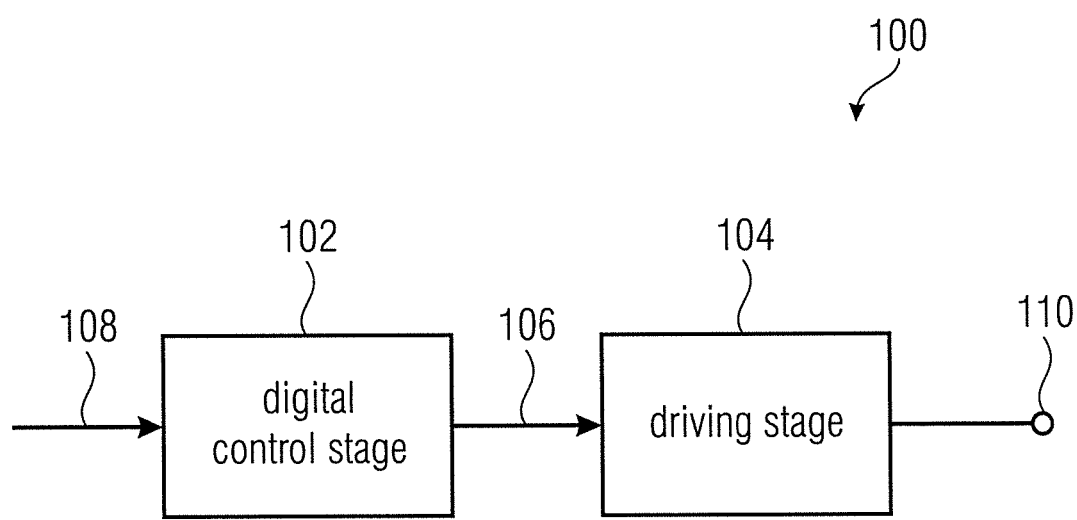
FIG. 1 shows a block diagram of a DC-DC converter for envelope tracking according to an embodiment.

Equal or equivalent elements or elements with equal or equivalent functionality are denoted in the following description by equal or equivalent reference numerals.

DETAILED DESCRIPTION

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a block diagram of a DC-DC converter 100 for envelope tracking according to an embodiment. The DC-DC converter 100 (DC-DC=direct current to direct current) comprises a digital control stage 102 and a driving stage 104. The digital control stage 102 is configured to provide a digital control signal 106 based on digital information 108 describing an amplitude of a digital baseband transmit signal. The driving stage 104 is configured to provide a supply voltage 110 for an RF amplifier (RF=radio frequency) based on the digital control signal 106.

In some embodiments, the DC-DC converter 100 for envelope tracking is adapted to use the digital information 108 of the amplitude of the baseband transmit signal to provide the supply voltage 110 for the RF amplifier.

For example, in some embodiments, a DC-DC converter 100 for envelope tracking is built by using the digital information 108 of the amplitude of the transmitted signal for calculating the width of the pulse width modulation.

Figure 2:
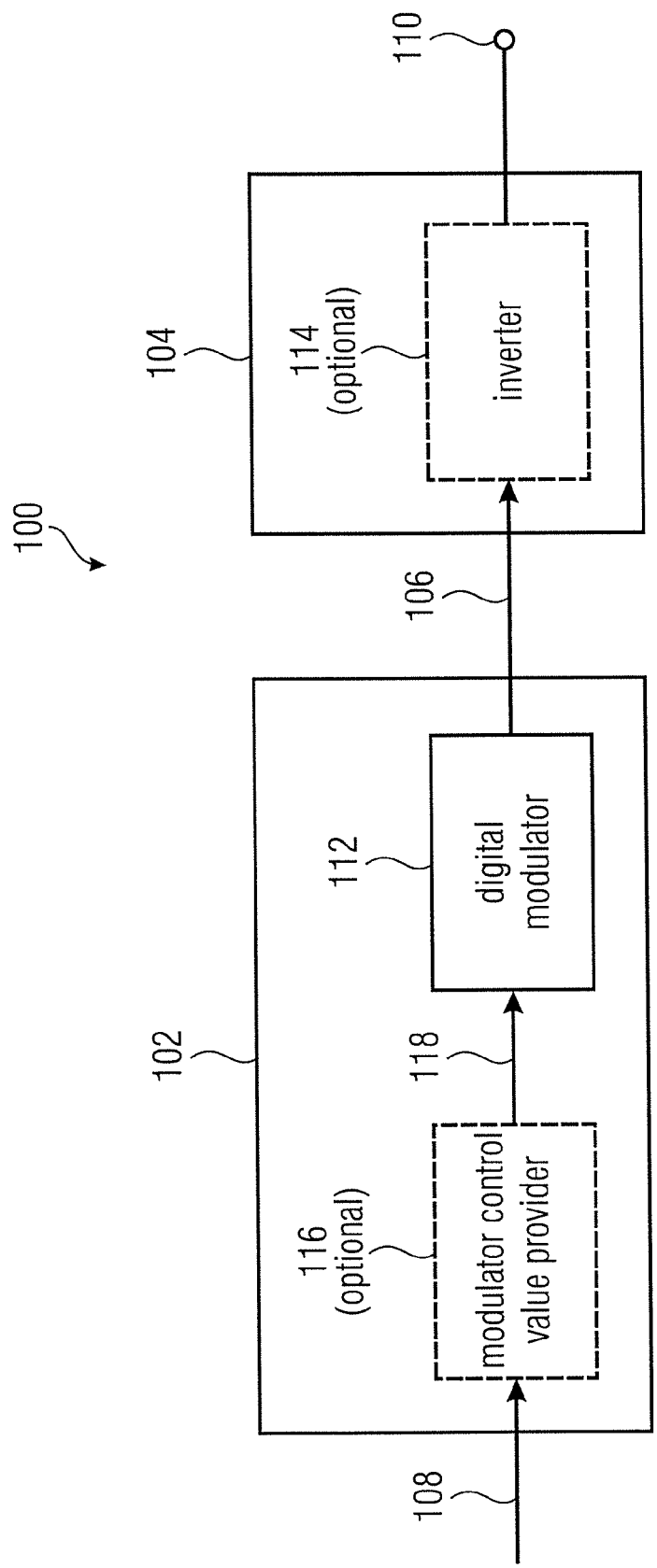
FIG. 2 shows a block diagram of a DC-DC converter for envelope tracking according to an embodiment.

FIG. 2 shows a block diagram of a DC-DC converter 100 for envelope tracking according to an embodiment. In addition to FIG. 1, the driving stage 102 comprises a digital modulator 112 configured to provide a modulated digital control signal 106 as the digital control signal 106 based on the digital information 108 describing the amplitude of the digital baseband transmit signal.

For example, the digital modulator 112 can be configured to control a pulse width of the modulated digital control signal 106 based on the digital information 108 describing the amplitude of the digital baseband transmit signal.

In some embodiments, the driving stage 104 can comprise an inverter 114 configured to provide a first voltage in response to a first state of the digital control signal 106 and provide a second voltage in response to a second state of the digital control signal 106 as the supply voltage 110 for the RF amplifier.

For example, the first voltage can be a supply voltage of a DC power supply and the second voltage can be a reference voltage, e.g. ground potential.

In other words, in some embodiments, the DC-DC converter 100 can comprise a digital modulator 112 and an inverter 114. The digital modulator 112 can be configured to provide a modulated digital control signal 106 based on digital information 108 describing an amplitude of a digital baseband transmit signal. The inverter 114 can be configured to provide a first voltage in response to a first state of the modulated digital control signal 106 and provide a second voltage in response to a second state of the modulated digital control signal 106 as a supply voltage 110 for an RF amplifier.

As shown in the example of FIG. 2, in some embodiments, the digital control stage 102 can comprise a data item provider 116 configured to provide one data item 118 of a plurality of possible data items in response to the digital information 108 describing the amplitude of the digital baseband transmit signal. Thereby, the digital modulator 112 can be configured to set a pulse width of the modulated digital control signal 106 based on the one data item 118.

In the following, known DC-DC converters 10 are described making reference to FIGS. 3 and 4 in order to point out the differences of the DC-DC converter 100 shown in FIGS. 1 and 2.

Figure 3:
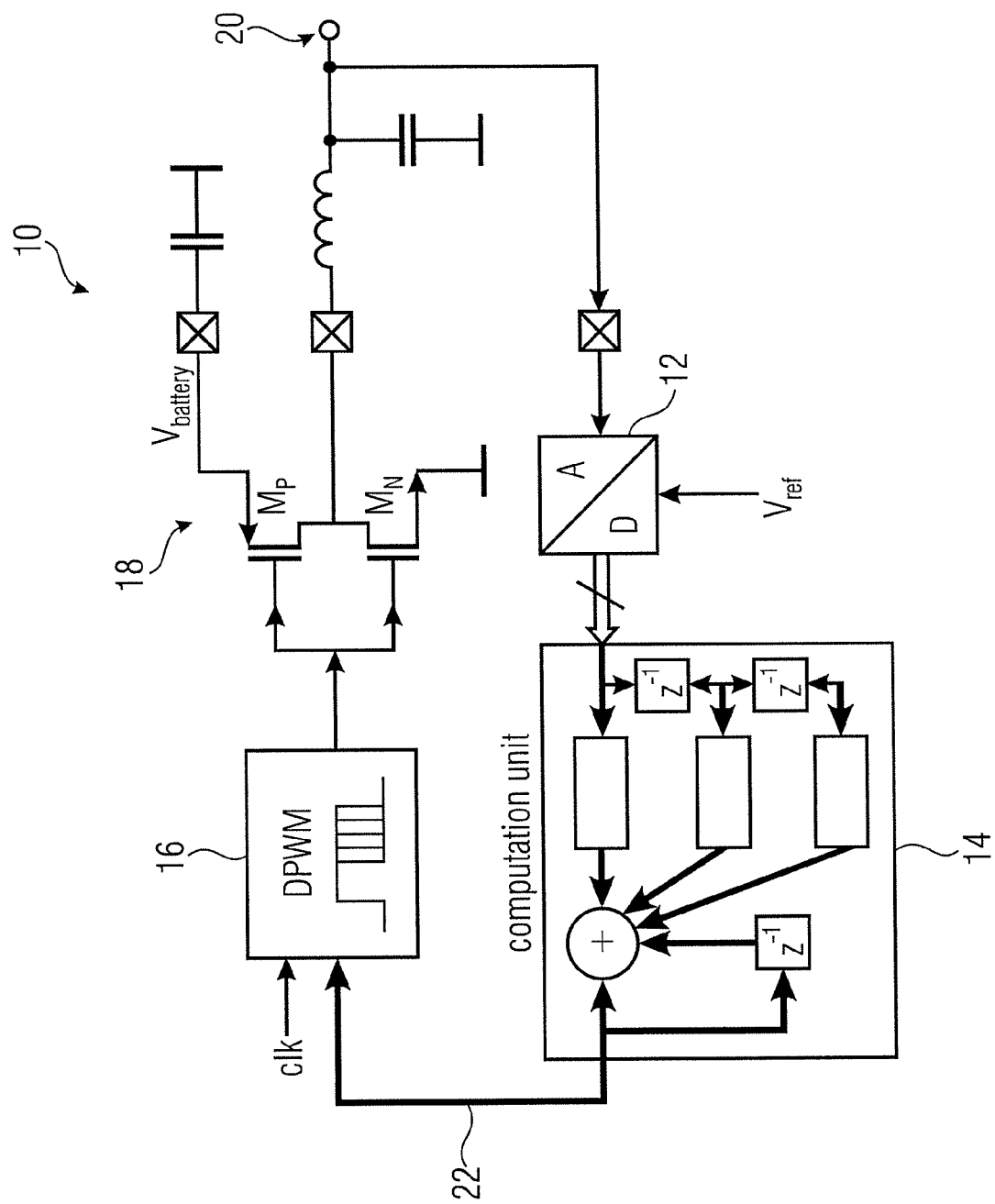
FIG. 3 shows a block diagram of a known DC-DC converter.

FIG. 3 shows a block diagram of a known DC-DC converter 10. The DC-DC converter 10 comprises an A/D converter 12, a computational unit 14, a DPWM 16 (DPWM=digital pulse width modulator) and an inverter 18. Thereby, the computational unit 14 is connected to an output 20 of the inverter 18 by means of the A/D converter 12. Hence, the signal 22 provided for the DPWM 16 by the computational unit 14 is based on the output voltage present at the output 20 of the inverter 18.

In other words, up to now the DC-DC converter was built in a conventional way either in an analog way or in a digital way as shown in FIG. 3. Thereby, the modulation of the voltage to do the envelope tracking is done by changing the reference voltage $V_{ref}$.

A disadvantage of this solution is that the frequency of the generated voltage is limited by the frequency of the pulse width modulation. It is clear, that this system cannot react faster than the switching frequency of the DC-DC converter 10. An additional frequency limitation is the loop filter in the DC-DC converter 10. The DC-DC converter in FIG. 3 needs a PID filter (PID=proportional integral derivative), because it's a system with feedback. For stability reasons a PID filter is necessary. It is easy to prove that a signal fed in at the $V_{ref}$ voltage is also filtered by this PID filter.

Figure 4:
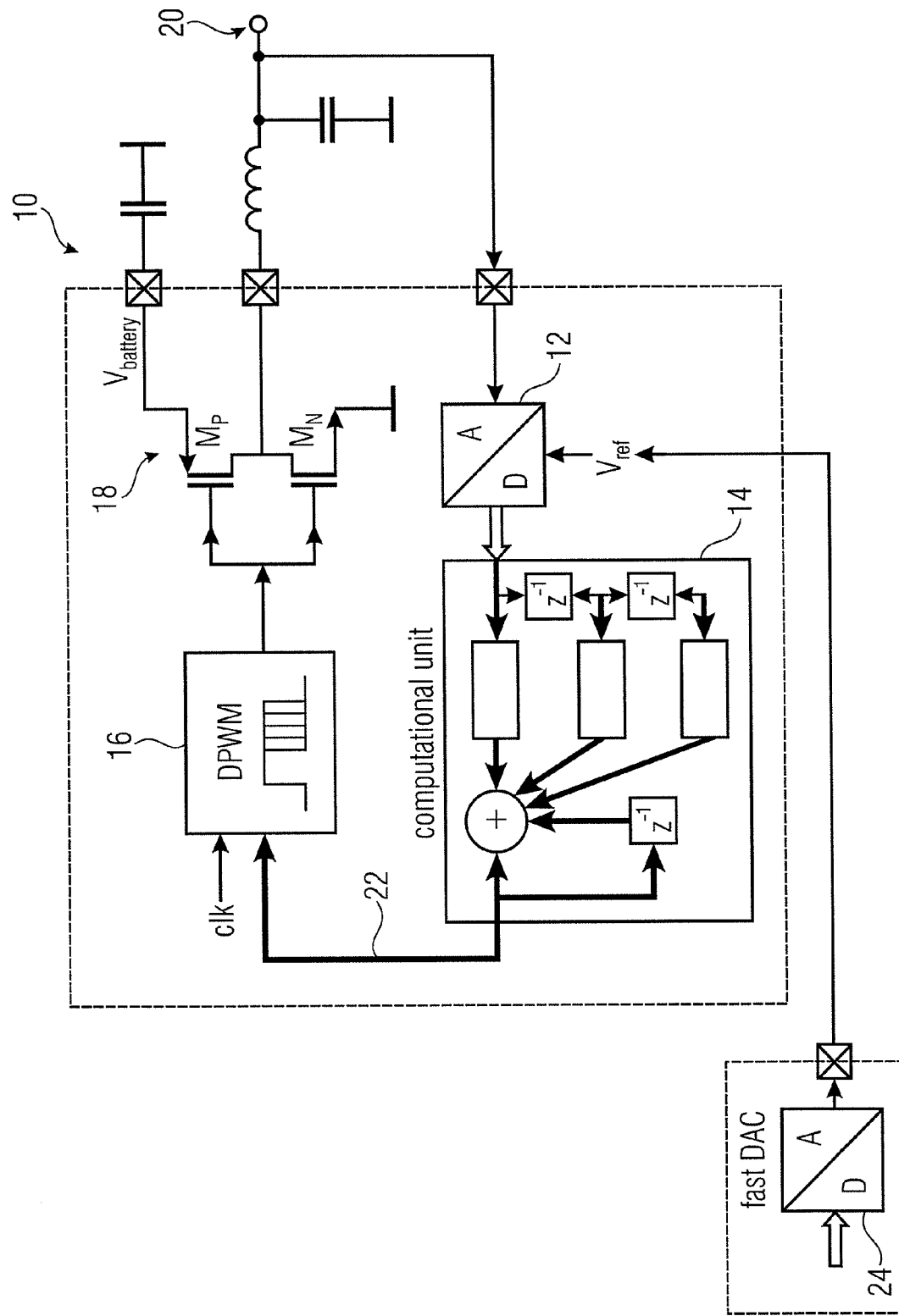
FIG. 4 shows a block diagram of a known DC-DC converter.

FIG. 4 shows a block diagram of a known DC-DC converter 10. In contrast to FIG. 3, the DC-DC converter 10 shown in FIG. 4 comprises a fast D/A converter 24 connected to the A/D converter 12.

The switching frequency for high efficient DC-DC converters 10 is up to 2 MHz. The baseband signal frequency for modern wireless standards is up to 40 MHz. For envelope tracking the absolute value of the baseband signal has to be generated by the DC-DC converter 10. Switching frequencies can be increased to 50 MHz with the disadvantage of less efficiency.

Subsequently, further embodiments of the DC-DC converter 100 are described that do not have the above mentioned limitations in switching frequency and/or efficiency.

Figure 5:
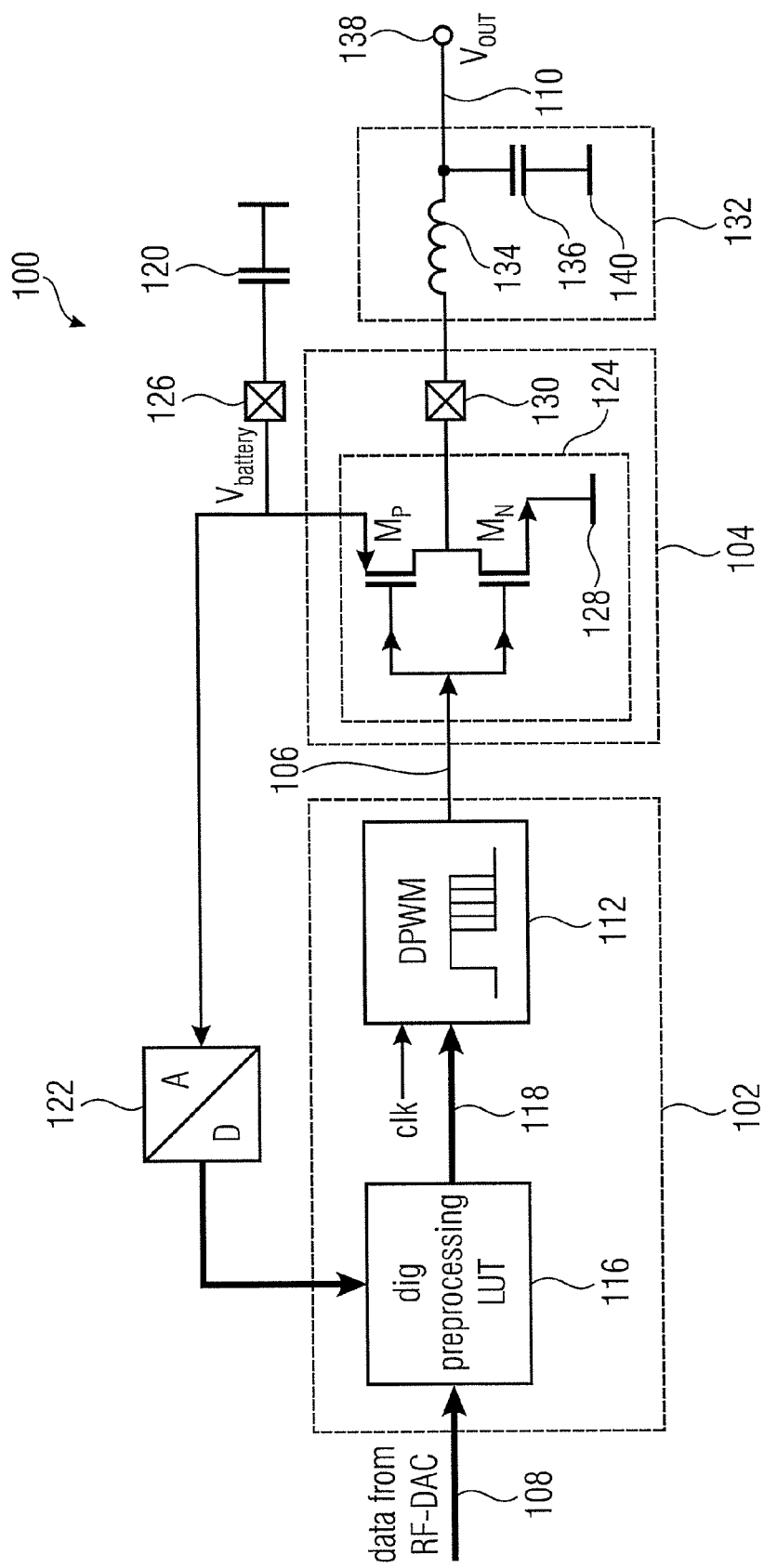
FIG. 5 shows a block diagram of a DC-DC converter according to an embodiment.

FIG. 5 shows a block diagram of a DC-DC converter 100 according to an embodiment. The DC-DC converter 100 comprises a digital control stage 102 and a driving stage 104.

The digital control stage 102 comprises a digital modulator 112 configured to provide a modulated digital control signal 106 and a data item provider 116 configured to provide one data item 118 of a plurality of possible data items in response to the digital information 108 describing the amplitude of the digital baseband transmit signal. Thereby, the digital modulator 112 can be configured to set a pulse width of the modulated digital control signal 106 based on the one data item 118.

For example, the data item 118 can comprise information (e.g. data item value) describing a pulse width of a pulse width modulated supply voltage 110 for the RF amplifier for envelope tracking. Furthermore, the plurality of possible data items can describe a plurality of possible pulse widths, wherein the data item provider 116 can be configured to select and provide the one data item 118 comprising the information describing the pulse width for envelope tracking corresponding to the amplitude of the digital baseband transmit signal.

In some embodiments, the data item provider 116 can be further configured to provide the one data item 118 in response to a digital voltage reading of a DC power supply 120. Thereby, the digital modulator 112 can be configured to set a period (or modulation period) of the modulated digital control signal 106 based on the one data item 118.

For example, the data item 118 can further comprise information (e.g. data item value) describing a period of a pulse width modulated supply voltage 110 for the RF amplifier for envelope tracking.

Moreover, the DC-DC converter 100 can comprise an A/D converter 122 configured to A/D convert an analog voltage reading of the DC power supply 120 into a digital voltage reading of the DC power supply 120.

As exemplarily shown in FIG. 5, the A/D converter 122 can be connected to a supply terminal 126 of the power supply 120. Furthermore, the DC power supply 120 can be a battery and the analog voltage reading a voltage of the battery $V_{battery}$.

In some embodiments, the control stage 102 can comprise a lookup table 116 as the data item provider 116. The lookup table 116 (or digital preprocessing LUT; LUT=lookup table) can be configured to provide one data item of the plurality of possible data items in response to the digital information 108 (data from RF-DAC; DAC=digital to analog converter) describing the amplitude of the digital baseband transmit signal.

In some embodiments, the control stage 102 can comprise a digital PWM 112 (DPWM) as the digital modulator 112. The digital PWM 112 can be configured to provide the modulated digital control signal 106 based on the one data item 106. The digital PWM 112 can be clocked with a clock Clk of a local oscillator. The local oscillator can be clocked with a frequency higher than 40 MHz (or 50 MHz, 60 MHz, 70 MHz, 80 MHz, 90 MHz or 100 MHz). Moreover, the modulated digital control signal 106 can comprise a first state (e.g. logic 1) and a second state (e.g. logic 0).

The driving stage 104 can comprise an inverter 124 configured to provide a first voltage in response to a first state of the modulated digital control signal 106 and provide a second voltage in response to a second state of the modulated digital control signal 106 as the supply voltage 110 for the RF amplifier.

For example, the first voltage can be a supply voltage of the DC power supply 120 and the second voltage can be a reference voltage, e.g. ground. Naturally, also every other voltage different from ground can be used as reference voltage.

As shown in the example of FIG. 5, the inverter can comprise a series connection of a n-channel MOSFET and a p-channel MOSFET (MOSFET=metal oxide semiconductor field-effect transistor). The n-channel MOSFET and the p-channel MOSFET can be connected in series between a ground terminal 128 and a supply terminal 126 to which the power supply 120 (e.g. battery) is connected and at which the supply voltage of the power supply 120 is present. Hence, the inverter 124 can be configured to provide the supply voltage of the DC power supply 120 in response to the first state (e.g. logic 1) of the modulated digital control signal 106 and the ground potential present at the ground terminal 128 in response to the second state (e.g. logic 0) of the modulated digital control signal 106 as the supply voltage 110 for the RF amplifier. Furthermore, the driving stage 104 (or inverter 124) can comprise an output terminal 130 at which the supply voltage 110 for the RF amplifier is provided.

In some embodiments, the DC-DC converter 100 can comprise a low pass filter 132 for low pass filtering the supply voltage 110 for the RF amplifier. The low pass filter 132 can comprise an inductor 134 and a capacitor 136 connected in series between the output terminal 130 of the inverter 124 and a ground terminal 140. Note that the same potential can be present at the ground terminal 140 of the low pass filter 132 and at the ground potential 128 of the inverter 124.

In other words, a DC-DC buck converter 100 is generating a voltage 110 which can be calculated by VOUT=D*$V_{BATTERY}$. The generated voltage 110 depends on the pulse width D and on the input voltage $V_{BATTERY}$.

The output voltage 110 can be generated directly by calculating the pulse width from the digital data 108 of the transmitted baseband signal and the measured battery voltage.

The difference to previous solutions (FIGS. 3 and 4) is that digital data 108 from transmitter are used directly, whereas in previous solutions this digital data was converted to an analog voltage and fed to the reference input of the DC-DC converter.

In some embodiments, at least the pulse width modulator 112 of the DC-DC converter 100 can be built on the same silicon as the digital transmitter because an interface of digital data cost pins and power. The splitting into two chips was the reason for analog interface up to now.

Figure 6:
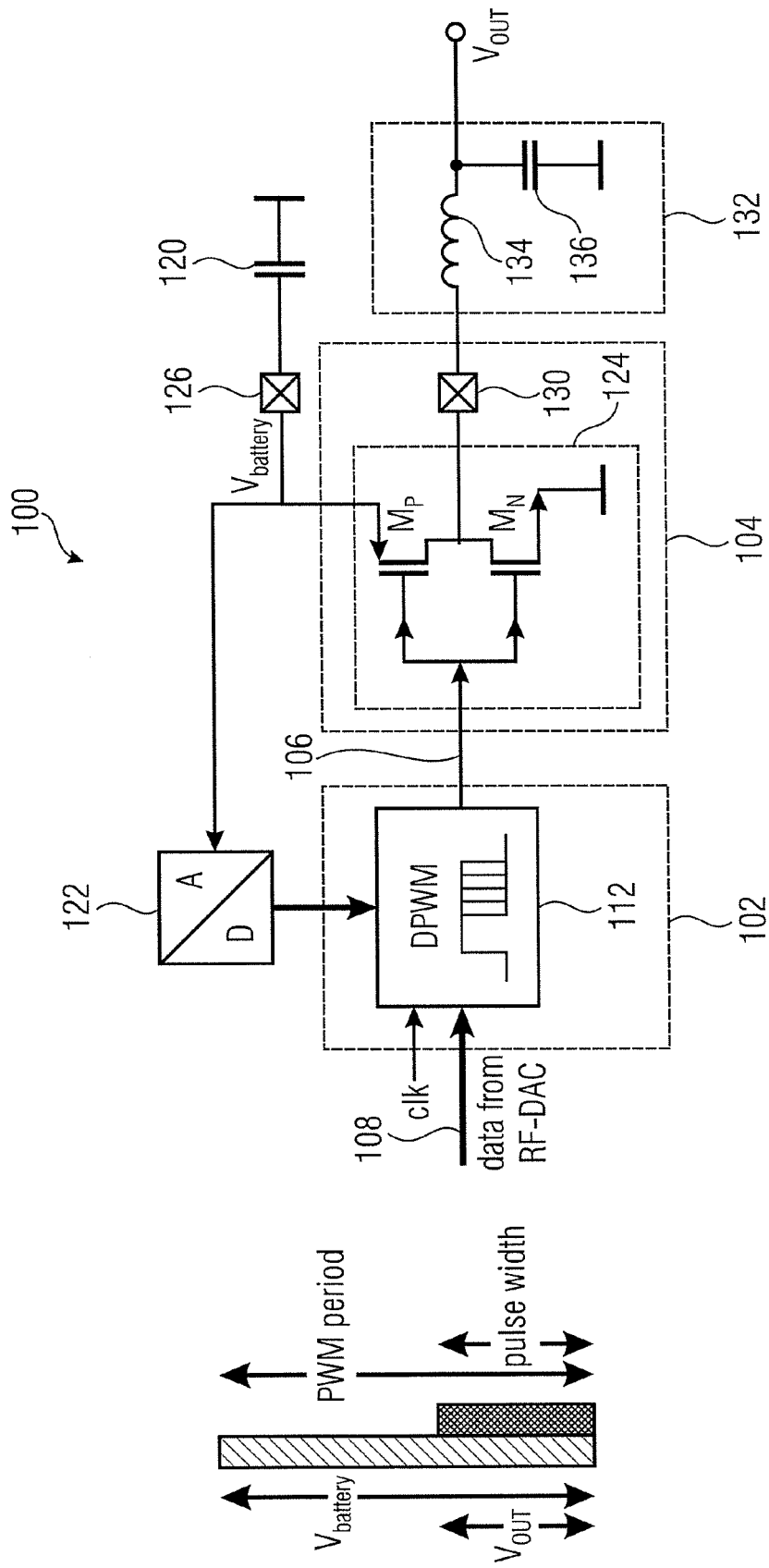
FIG. 6 shows a block diagram of a DC-DC converter according to an embodiment.

FIG. 6 shows a block diagram of a DC-DC converter 100 according to an embodiment. In contrast to FIG. 5, the digital control stage 102 comprises a digital modulator 112 configured to provide a modulated digital control signal 106 as the digital control signal 106 based on the digital information 108 describing the amplitude of the digital baseband transmit signal. Thereby, the digital modulator 112 can be configured to control a pulse width of the modulated digital control signal 106 based on the digital information 108 describing the amplitude of the digital baseband transmit signal.

In some embodiments, the digital modulator 112 can be configured to control a period (or modulation period) of the modulated digital control signal 106 based on a digital voltage reading of a DC power supply 120.

As shown in the example of FIG. 6, the DC-DC converter 100 can comprise an A/D converter 122 configured to A/D convert an analog voltage reading of the DC power supply 120 into a digital voltage reading of the DC power supply 120. The A/D converter 122 can be connected to the supply terminal 126 of the power supply 120.

As already mentioned, in some embodiments, the control stage 102 can comprise a digital PWM 112 (DPWM) as the digital modulator 112. The digital PWM 112 can be configured to provide the modulated digital control signal 106 based on the digital information 108. The digital PWM 112 can be clocked with a clock Clk of a local oscillator. The local oscillator can be configured to provide a clock frequency of at least 40 MHz (or 50 MHz, 60 MHz, 70 MHz, 80 MHz, 90 MHz or 100 MHz, for example).

In other words, the output voltage 110 can be generated directly by calculating the pulse width from the digital data 108 of the transmitted baseband signal and the measured battery voltage. Moreover, the PWM period can be modulated by the $V_{battery}$ measurement result, in contrast to the digital preprocessing shown in FIG. 5.

For increasing the resolution, the clock Clk of the PWM modulator 112 can be as high as possible. For example, a local oscillator clock can be used. Limited Clk can lead to lower resolution and accordingly to quantization error and accordingly to noise.

Figure 7:
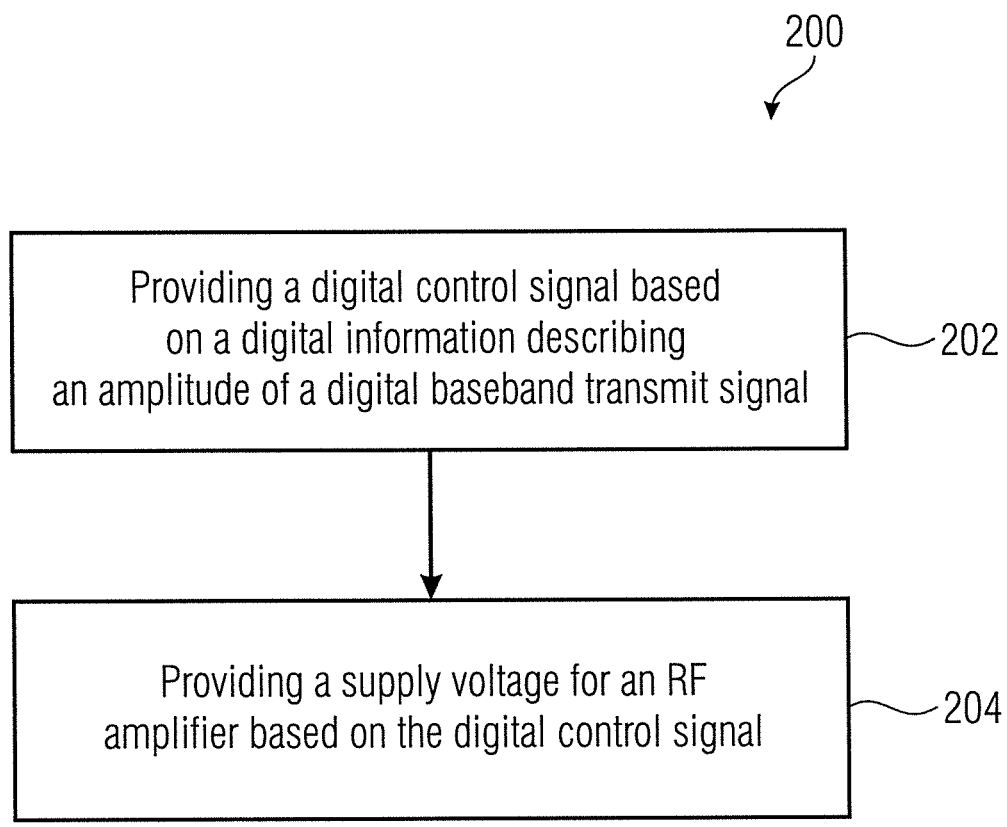
FIG. 7 shows a flowchart of a method for envelope tracking.

FIG. 7 shows a flowchart of a method 200 for envelope tracking. The method 200 comprises a step 202 of providing a digital control signal based on digital information describing an amplitude of a digital baseband transmit signal; and a step 204 of providing a supply voltage for a RF amplifier based on the digital control signal.

Figure 8:
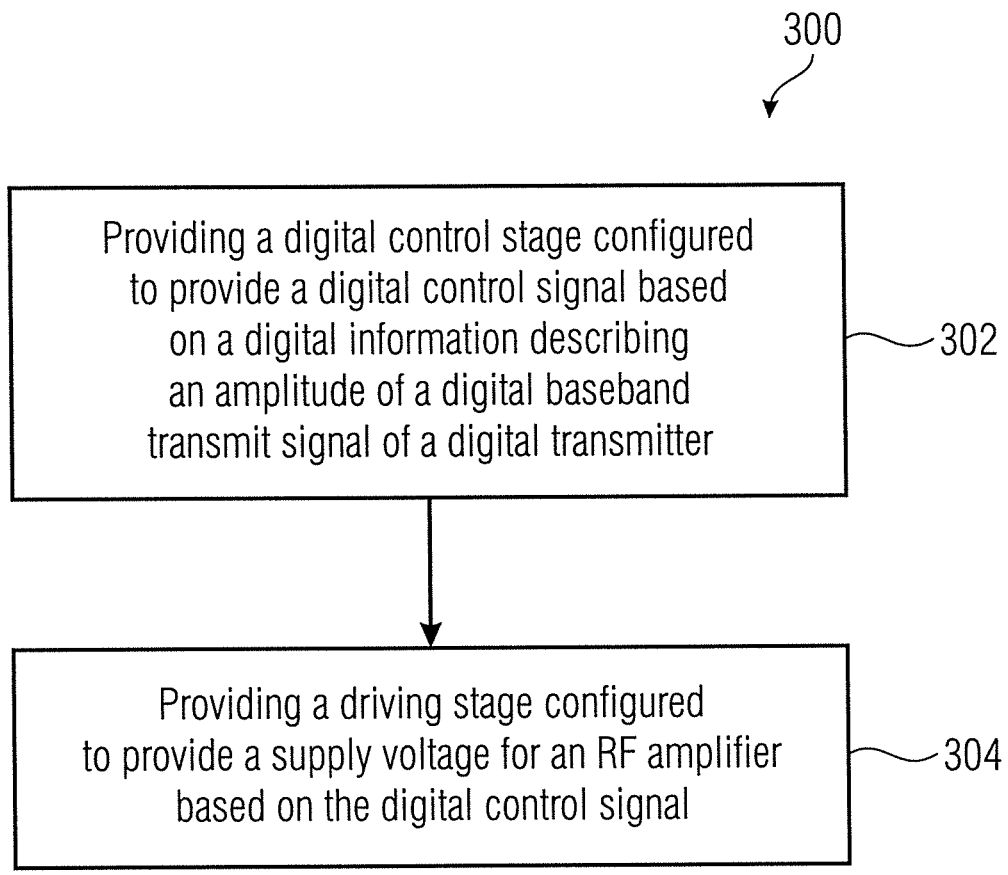
FIG. 8 shows a flow chart of a method for manufacturing a DC-DC converter for envelope tracking.

FIG. 8 shows a flow chart of a method 300 for manufacturing a DC-DC converter for envelope tracking. The method 300 comprises a step 302 of providing a digital control stage configured to provide a digital control signal based on a digital information describing an amplitude of a digital baseband transmit signal of a digital transmitter; and a step 304 of providing a driving stage configured to provide a supply voltage for a RF amplifier based on the digital control signal.

In some embodiments, the digital control stage can be provided on a chip (e.g. silicon) of the digital transmitter. Furthermore, the driving stage can be provided on the chip of the digital transmitter.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A DC-DC converter for envelope tracking, comprising:
a digital control stage comprising a digital modulator that is configured to generate a digital control signal in response to receiving digital information describing an amplitude of a digital baseband transmit signal and a digital value of a digital voltage reading from a battery voltage; and
a driving stage configured to provide a supply voltage for an RF amplifier based on the digital control signal.

2. The DC-DC converter according to claim 1, wherein the digital modulator is further configured to generate a modulated digital control signal based on the digital information describing the amplitude of the digital baseband transmit signal.

3. The DC-DC converter according to claim 2, wherein the digital modulator is configured to control a pulse width of the modulated digital control signal as a function of the digital information describing the amplitude of the digital baseband transmit signal.

4. The DC-DC converter according to claim 2, wherein the digital modulator is configured to control a period of the modulated digital control signal as a function of the digital voltage reading of the battery voltage.

5. The DC-DC converter according to claim 2, wherein the the digital modulator comprises a digital PWM that is configured to control a pulse width of the modulated digital control signal as a function of the digital information and control a modulation period of the modulated digital control signal as a function of the digital value of the digital voltage reading of the battery voltage.

6. The DC-DC converter according to claim 2, wherein the digital control stage comprises a data item provider configured to generate one of a plurality of possible data items based on the digital information describing the amplitude of the digital baseband transmit signal;
wherein the digital modulator is configured to set a pulse width of the modulated digital control signal based on the one data item.

7. The DC-DC converter according to claim 6, wherein the data item provider is further configured to generate the one data item based on the digital value of the digital voltage reading of the battery voltage;
wherein the digital modulator is configured to set a period of the modulated digital control signal based on the one data item.

8. The DC-DC converter according to claim 6, wherein the data item provider is configured to select the one of the plurality of possible data items from a lookup table as a function of the digital information and the digital value of the digital voltage reading.

9. The DC-DC converter according to claim 1, wherein the driving stage comprises an inverter configured to generate a first voltage in response to a first state of the digital control signal and to generate a second voltage in response to a second state of the digital control signal as the supply voltage for the RF amplifier.

10. The DC-DC converter according to claim 9, wherein the first voltage comprises a supply voltage of a DC power supply and the second voltage comprises a reference voltage.

11. A DC-DC converter for envelope tracking, comprising:
a digital modulator configured to receive digital information that describes an amplitude of a digital baseband transmit signal from a transmitter and a digital value of a digital voltage reading from a DC power supply, and generate a modulated digital control signal as a function of the digital information and the digital value;
an inverter configured to provide a first voltage in response to a first state of the modulated digital control signal and to provide a second voltage in response to a second state of the modulated digital control signal as a supply voltage for an RF amplifier.

12. The DC-DC converter according to claim 11, wherein the digital modulator is configured to set a pulse width of the modulated digital control signal based on the digital information describing the amplitude of the digital baseband transmit signal, and set a period of the modulated digital control signal based on the digital value.

13. The DC-DC converter according to claim 11, wherein the DC-DC converter comprises an A/D converter configured to A/D convert an analog voltage reading of the DC power supply into the digital voltage reading of the DC power supply;
wherein the digital modulator is configured to set a period of the modulated digital control signal based on the digital value of the digital voltage reading of the DC power supply.

14. The DC-DC converter according to claim 11, wherein the the digital modulator comprises a digital PWM configured to generate the modulated digital control signal that controls the supply voltage as a function of a pulse width from the digital information and the digital value.

15. The DC-DC converter according to claim 11, wherein the digital modulator is further configured to obtain one of a plurality of possible data items from a lookup table in response to receiving the information describing the amplitude of the digital baseband transmit signal and the digital value of the digital voltage reading;
wherein the digital modulator is configured to set a pulse width of the modulated digital control signal based on the one of the plurality of possible data items.

16. The DC-DC converter according to claim 15, wherein the DC-DC converter comprises an A/D converter configured to A/D convert an analog voltage reading of a DC power supply into a digital voltage reading of the DC power supply;
wherein the digital modulator is further configured to process the one data item from the lookup table in response to the digital voltage reading of the DC power supply and
to set a period of the modulated digital control signal based on the one data item.

17. The DC-DC converter according to claim 11, wherein the first voltage is a supply voltage of a DC power supply and the second voltage is a reference voltage.

18. The DC-DC converter according to claim 11, wherein the DC-DC converter comprises a low pass filter for low pass filtering the supply voltage for the RF amplifier.

19. A method for envelope tracking, comprising:
receiving, via a transmitter, digital information that indicates an amplitude of a digital baseband transmit signal of the transmitter and a digital value of a digital voltage reading from a power supply;
generating, via a digital modulator, a digital control signal based on the digital information and the digital value; and
providing a supply voltage for an RF amplifier based on the digital control signal.

20. A method for manufacturing a DC-DC converter for envelope tracking, comprising:
providing a digital control stage configured to generate a digital control signal from a digital information received from a digital transmitter that describes an amplitude of a digital baseband transmit signal of the digital transmitter and from a digital value received from a digital voltage reading of a battery voltage; and
providing a driving stage configured to generate a supply voltage for a RF amplifier based on the digital control signal.

21. The method according to claim 20, wherein the digital control stage is provided on a silicon of a same chip as the digital transmitter.

22. The method according to claim 21, wherein the driving stage is provided on the same chip as the digital transmitter.

* * * * *